(12) United States Patent
Wu

(10) Patent No.: US 12,424,519 B2
(45) Date of Patent: Sep. 23, 2025

(54) SEMICONDUCTOR STRUCTURE, METHOD FOR MANUFACTURING SEMICONDUCTOR STRUCTURE, AND MEMORY

(71) Applicant: CHANGXIN MEMORY TECHNOLOGIES, INC., Hefei (CN)

(72) Inventor: Shuangshuang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 621 days.

(21) Appl. No.: 17/809,502

(22) Filed: Jun. 28, 2022

(65) Prior Publication Data

US 2023/0060502 A1 Mar. 2, 2023

Related U.S. Application Data

(63) Continuation of application No. PCT/CN2021/124955, filed on Oct. 20, 2021.

(30) Foreign Application Priority Data

Aug. 27, 2021 (CN) .............................. 202110996032

(51) Int. Cl.
*H01L 23/48* (2006.01)
*H01L 21/768* (2006.01)
*H01L 23/535* (2006.01)

(52) U.S. Cl.
CPC ...... *H01L 23/481* (2013.01); *H01L 21/76805* (2013.01); *H01L 21/76829* (2013.01);
(Continued)

(58) Field of Classification Search
CPC ............ H01L 23/481; H01L 21/76805; H01L 21/76829; H01L 21/7684; H01L 21/76843;
(Continued)

(56) References Cited

U.S. PATENT DOCUMENTS 5,231,052 A * 7/1993 Lu ..................... H01L 21/76877
257/E21.585
8,895,385 B2 11/2014 Chang
(Continued)

FOREIGN PATENT DOCUMENTS

| CN | 102420175 A | 4/2012 |
|---|---|---|
| CN | 103904025 A | 7/2014 |

(Continued)

*Primary Examiner* — Julia Slutsker
(74) *Attorney, Agent, or Firm* — SYNCODA LLC; Feng Ma

(57) ABSTRACT

A semiconductor structure includes: a base, including a substrate, a first isolation layer, a first dielectric layer, and a stop layer that are formed in a stack manner, a first contact hole being formed in the base; a first insulating layer and a first barrier layer sequentially formed on an inner wall of the first contact hole, a first contact structure being disposed in the first contact hole; a protective layer covering an upper surface of the first contact structure; a second dielectric layer and a second isolation layer sequentially stacked on the protective layer, a second contact hole being formed in the base; and a second barrier layer formed on an inner wall of the second contact hole and a second contact structure disposed in the second contact hole.

14 Claims, 29 Drawing Sheets

(52) U.S. Cl.
CPC .... *H01L 21/7684* (2013.01); *H01L 21/76843* (2013.01); *H01L 21/76895* (2013.01); *H01L 21/76898* (2013.01); *H01L 23/535* (2013.01)

(58) Field of Classification Search
CPC ......... H01L 21/76895; H01L 21/76898; H01L 23/535; H01L 21/76832; H01L 21/76834; H01L 21/76849; H01L 23/522; H01L 23/53295
See application file for complete search history.

(56) References Cited

U.S. PATENT DOCUMENTS

| | | | |
|---|---|---|---|
| 10,147,719 B2 | 12/2018 | Wang | |
| 10,504,776 B2 | 12/2019 | Chen | |
| 11,961,865 B2* | 4/2024 | Togashi | H10F 39/812 |
| 2013/0285125 A1* | 10/2013 | Chen | H10D 30/60 |
| | | | 257/288 |
| 2014/0319587 A1 | 10/2014 | Chen et al. | |
| 2018/0138168 A1* | 5/2018 | Wang | H10D 62/151 |
| 2018/0337112 A1 | 11/2018 | Chen et al. | |
| 2020/0035613 A1* | 1/2020 | Kim | H01L 21/76877 |

FOREIGN PATENT DOCUMENTS

| | | |
|---|---|---|
| CN | 106601715 A | 4/2017 |
| IN | 101118922 A | 2/2008 |

* cited by examiner

SEMICONDUCTOR STRUCTURE, METHOD FOR MANUFACTURING SEMICONDUCTOR STRUCTURE, AND MEMORY

CROSS-REFERENCE TO RELATED APPLICATIONS

This is a continuation application of International Patent Application No. PCT/CN2021/124955 filed on Oct. 20, 2021, which claims priority to Chinese Patent Application No. 202110996032.1 filed on Aug. 27, 2021. The disclosures of these applications are hereby incorporated by reference in their entirety.

BACKGROUND

With the development and advancement of technology, the use of chips is becoming more and more widespread, and multilayer silicon wafers of the chip are connected by Through-Silicon Vias (TSVs). In a Middle TSV structure, a TSV manufacturing step is performed in a back end of line process. That is, a TSV process is performed after a contact hole (CT) process and before a wiring process. However, there are two problems in the process of the design of this structure.

(1) In a TSV Chemical Mechanical Polishing (CMP) process, the CMP process cannot be adequately controlled, resulting in a large variation in a film thickness after the process.

(2) In the wiring process, there is a problem of contamination of electromigration in a wiring area.

Therefore, how to solve the above technical problems has become a pressing problem for those skilled in the art.

SUMMARY

The present disclosure relates to the field of semiconductor technologies, and specifically relates to a semiconductor structure, a method for manufacturing a semiconductor structure, and a memory.

An objective of the embodiments of the present disclosure is to provide a semiconductor structure, a method for manufacturing a semiconductor, and a memory, to resolve the foregoing technical problems.

To resolve the foregoing problem, a first aspect of the embodiments of the present disclosure provides a semiconductor structure, including:

a base, including a substrate, a first isolation layer, a first dielectric layer, and a stop layer that are formed in a stack manner, where a first contact hole is formed in the base, the first contact hole is formed to extend from the stop layer into the substrate, and a rim of the first contact hole is flush with an upper surface of the stop layer;

a first insulating layer, a first barrier layer, and a first contact structure, where the first insulating layer and the first barrier layer are sequentially formed on an inner wall of the first contact hole, and the first contact structure is disposed in the first contact hole;

a protective layer, formed to cover an upper surface of the first contact structure;

a second dielectric layer and a second isolation layer, sequentially formed on the protective layer in a stack manner, where a second contact hole is formed in the base, and the second contact hole is formed to penetrate through the second dielectric layer, the second isolation layer, and the protective layer and stop at the first contact structure; and a second barrier layer and a second contact structure, where the second barrier layer is formed on an inner wall of the second contact hole, and the second contact structure is disposed in the second contact hole.

A second aspect of the embodiments of the present disclosure provides a method for manufacturing a semiconductor structure, including:

providing a base including a substrate, a first isolation layer, a first dielectric layer, and a stop layer that are formed in a stack manner;

forming in the base a first contact hole extending from the stop layer into the substrate, where a rim of the first contact hole is flush with an upper surface of the stop layer;

forming sequentially on an inner wall of the first contact hole a first insulating layer, a first barrier layer and a first contact structure filling the first contact hole, where an upper surface of the first contact structure is exposed;

forming a protective layer covering the upper surface of the first contact structure;

forming a second dielectric layer and a second isolation layer on the protective layer in a stack manner;

forming a second contact hole penetrating through the second dielectric layer, the second isolation layer, and the protective layer, stopping at the first contact structure, and exposing the upper surface of the first contact structure; and forming on an inner wall of the second contact hole a second barrier layer and a second contact structure filling the second contact hole.

A third aspect of the embodiments of the present disclosure provides a memory, including a semiconductor structure in any one of the above embodiments.

REFERENCE NUMERALS

10. base; 20. first insulating layer; 30. first barrier layer; 40. first contact structure; 50. protective layer; 60. second dielectric layer; 70. second isolation layer; 80. second barrier layer; 90. second contact structure; 100. sacrifice layer; 110. semiconductor device; 120. conductive structure; 130. electrical contact structure; 11. substrate; 12. first isolation layer; 13. first dielectric layer; 14. stop layer; 15. first contact hole; 21. second contact hole; and 22. conductive via.

DETAILED DESCRIPTION

To make the objectives, technical solutions, and advantages of the present disclosure clearer and more understandable, the present disclosure is further described in detail below in conjunction with specific embodiments and with reference to the accompanying drawings. It should be understood that these descriptions are merely exemplary and are not intended to limit the scope of the present disclosure. In addition, in the following description, descriptions of well-known structures and techniques are omitted to avoid unnecessary confusion of the concepts of the present disclosure.

In the description of the present disclosure, it needs to be noted that the terms "first" and "second" are used only for description, but are not intended to indicate or imply relative importance.

Unless otherwise defined, the technical terms and scientific terms used herein have the same meanings as generally understood by a person skilled in the art to which the present disclosure pertains. The terms used herein in the specification of the present disclosure are merely used for describing specific embodiments, but are not intended to limit the present disclosure.

As used herein, the singular forms "a," "an", and "the" are intended to include the plural forms as well, unless the context clearly indicates otherwise. It should be further understood that the terms such as "include/comprise" and/or "have" specify the presence of stated features, integers, steps, operations, components, sections, or combinations thereof, but do not preclude the presence or addition of one or more other features, integers, steps, operations, components, sections, or combinations thereof. In addition, the used term "and/or" in this specification includes any and all combinations of the associated listed items.

Figure 1:
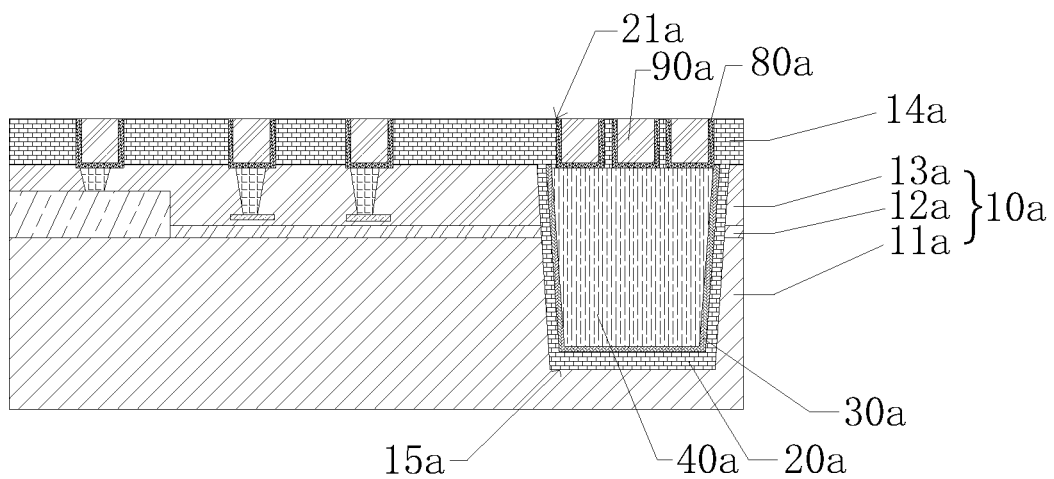
FIG. 1 is a schematic structural diagram of a semiconductor structure in some implementations.
Figure 2:
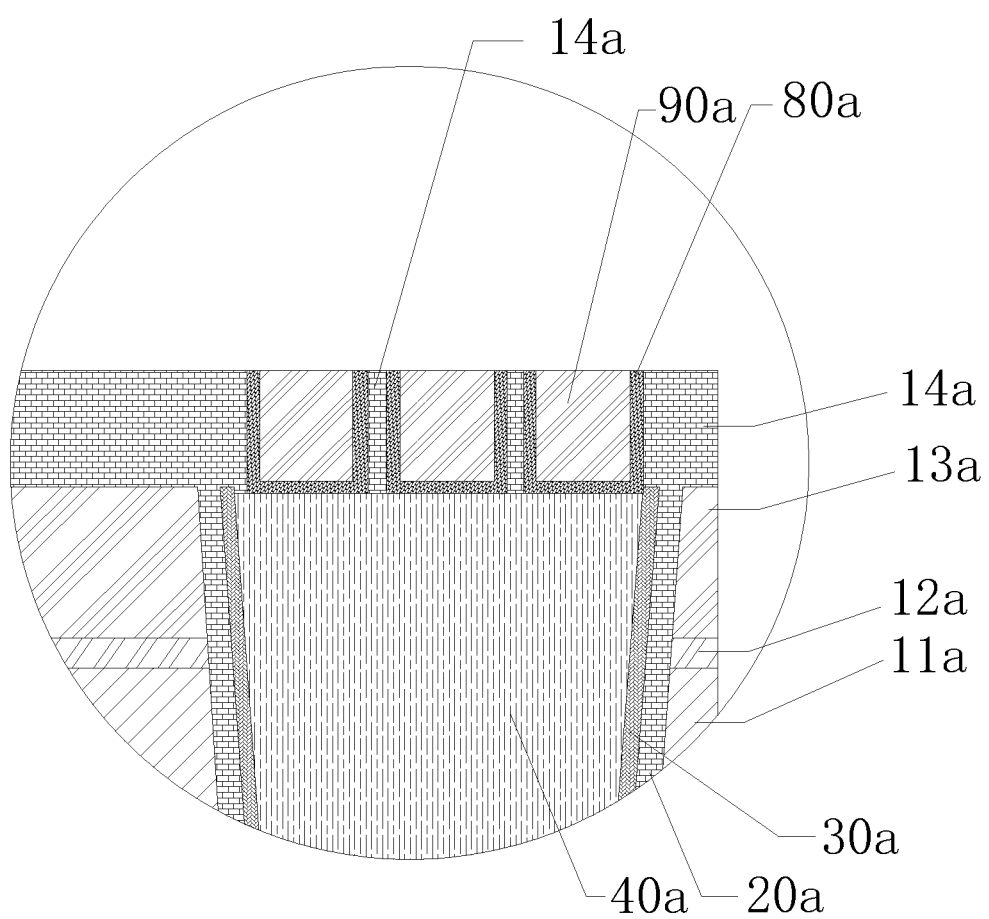
FIG. 2 is a partial schematic enlarged view of the semiconductor structure in FIG. 1.
Figure 3:
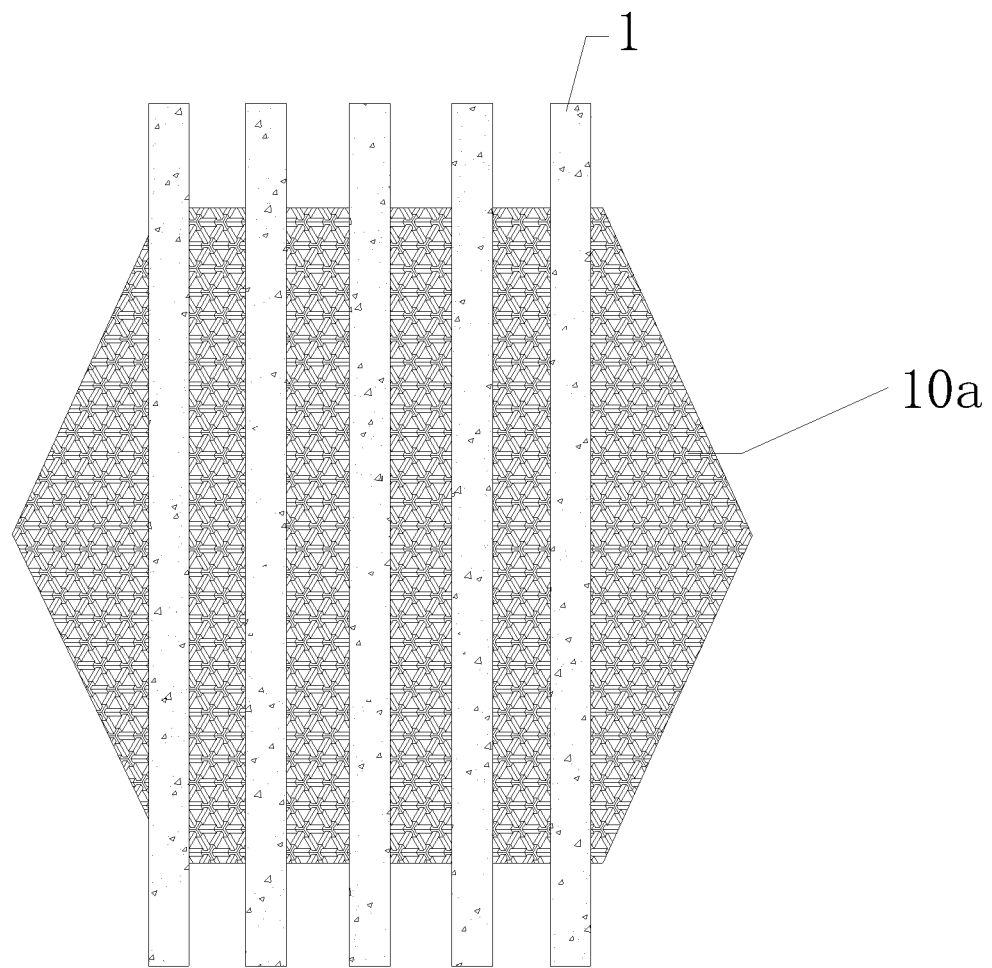
FIG. 3 is a schematic top view of the semiconductor structure in FIG. 1.
Figure 4:
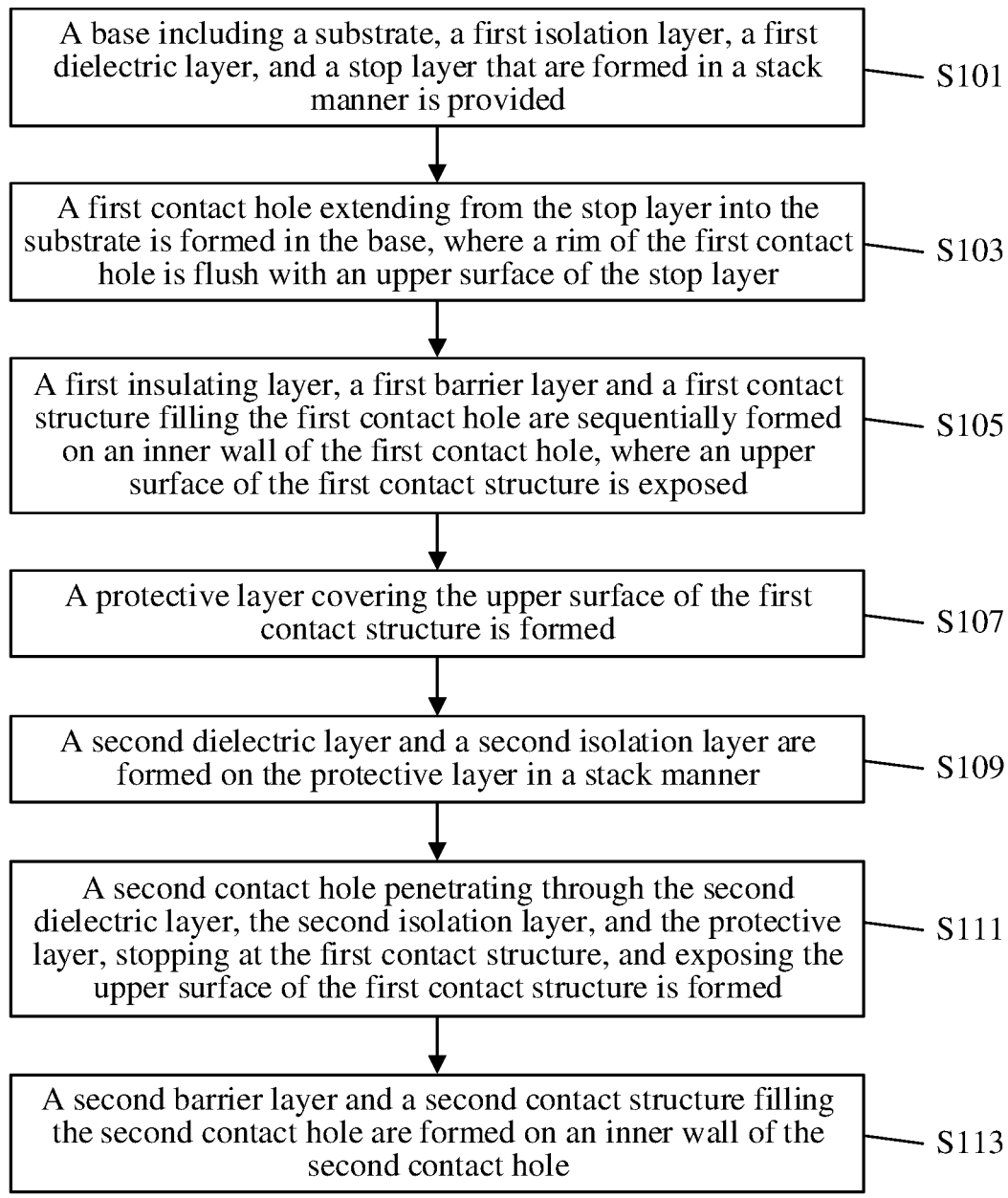
FIG. 4 is a flowchart of a method for manufacturing a semiconductor structure according to an exemplary embodiment.

As shown in FIG. 1 to FIG. 3, a semiconductor structure includes a base 10a, an inter-layer insulating layer 20a, an inter-layer barrier layer 30a, a hole contact structure 40a, a top barrier layer 80a, and a top contact structure 90a. Referring to FIG. 1, the base 10a includes a substrate 11a, an isolation layer 12a, a dielectric layer 13a, and a top insulating layer 14a that are formed in a stack manner. The base 10a is formed with a bottom contact hole 15a. The bottom contact hole 15a is formed to extend from the dielectric layer 13a into the substrate 11a. The inter-layer insulating layer 20a is formed to cover an inner wall of the bottom contact hole 15a, and the top insulating layer 14a is formed to cover an upper surface of the dielectric layer 13a. The inter-layer barrier layer 30a is formed to cover a surface of the inter-layer insulating layer 20a, and the hole contact structure 40a is disposed in the bottom contact hole 15a. The semiconductor structure is formed with a top contact hole 21a. The top contact hole 21a is formed to penetrate through the top insulating layer 14a and stop at an upper surface of the hole contact structure 40a. The top barrier layer 80a is formed on an inner wall of the top contact hole 21a and is connected to the via contact structure 40a. The top contact structure 90a is disposed in the top contact hole 21a.

It needs to note that before the top insulating layer 14a is formed, CMP needs to be performed on the upper surface of the dielectric layer 13a. That is, the upper surface of the dielectric layer 13a is planarized, to remove partial structures of the inter-layer insulating layer 20a, the inter-layer barrier layer 30a, and the hole contact structure 40a formed on the upper surface of the dielectric layer 13a. However, in some implementations, a CMP process cannot be well controlled. Therefore, there is a relatively large variation in the thickness of the semiconductor structure. That is, there is a relatively large variation in the thickness after the base 10a is manufactured. In addition, reference is made to FIG. 2. As can be seen from FIG. 2, the structure of the top insulating layer 14a formed between the top contact holes 21a directly contacts the upper surface of the hole contact structure 40a. Referring to FIG. 3, it needs to be understood that the top barrier layer 80a and the top contact structure 90a form a wiring structure 1. A plurality of wiring structures 1 are arranged at intervals on the base 10a, and the top insulating layer 14a is formed to fill a gap between the wiring structures 1. It may be understood that the structure of the top insulating layer 14a formed in the gap between the wiring structures 1 directly contacts the via contact structure 40a. The material for forming the top insulating layer 14a includes silicon dioxide, and the material for forming the via contact structure 40a includes copper. Because the top insulating layer 14a directly contacts the upper surface of the hole contact structure 40a, the problem of electromigration is caused, thereby affecting the reliability of the manufactured semiconductor.

Therefore, how to solve the above problems has become a pressing problem for those skilled in the art.

Embodiments of the present disclosure provide a semiconductor structure. The semiconductor structure includes a base, a first insulating layer, a first barrier layer, a first contact structure, a protective layer, a second dielectric layer, a second isolation layer, a second barrier layer, and a second contact structure. The base includes a substrate, a first isolation layer, a first dielectric layer, and a stop layer that are formed in a stack manner. A first contact hole is formed in the base, the first contact hole is formed to extend from the stop layer into the substrate, and a rim of the first contact hole is flush with an upper surface of the stop layer. The first insulating layer and the first barrier layer are sequentially formed on an inner wall of the first contact hole. The first contact structure is disposed in the first contact hole. The protective layer is formed to cover an upper surface of the first contact structure. The second dielectric layer and the second isolation layer are sequentially formed on the protective layer in a stack manner. A second contact hole is formed in the base. The second contact hole is formed to penetrate through the second dielectric layer, the second isolation layer, and the protective layer and to stop at the first contact structure. The second barrier layer is formed on an inner wall of the second contact hole, and the second contact structure is disposed in the second contact hole.

In the embodiments of the present disclosure, on the one hand, during the manufacturing of the semiconductor structure, before the second dielectric layer is formed, the stop layer is formed on the upper surface of the first dielectric layer, for controlling the thickness in the manufacturing of the semiconductor structure; on the other hand, the protective layer is formed on the upper surface of the first contact structure, so that the first contact structure can be prevented from directly contacting the second dielectric layer on the protective layer, to avoid the problem of electromigration.

In some embodiments, a material for forming the protective layer includes tantalum or silicon nitride.

In some embodiments, the protective layer is formed by a deposition process, and the protective layer is formed to cover the upper surface of the first contact structure and a surface of the stop layer.

In some embodiments, the stop layer is formed by a deposition process, the stop layer is formed to cover a surface of the first dielectric layer, and a material for forming the stop layer includes silicon nitride.

A second aspect of the embodiments of the present disclosure provides a method for manufacturing a semiconductor structure. The method includes the following operations.

A base including a substrate, a first isolation layer, a first dielectric layer, and a stop layer that are formed in a stack manner is provided.

A first contact hole extending from the stop layer into the substrate is formed in the base, where a rim of the first contact hole is flush with an upper surface of the stop layer.

A first insulating layer, a first barrier layer and a first contact structure filling the first contact hole are sequentially formed on an inner wall of the first contact hole, where an upper surface of the first contact structure is exposed.

A protective layer covering the upper surface of the first contact structure is formed.

A second dielectric layer and a second isolation layer are formed on the protective layer in a stack manner.

A second contact hole penetrating through the second dielectric layer, the second isolation layer, and the protective layer, stopping at the first contact structure, and exposing the upper surface of the first contact structure is formed.

A second barrier layer and a second contact structure filling the second contact hole are formed on an inner wall of the second contact hole.

In the embodiments of the present disclosure, on the one hand, during the manufacturing of the semiconductor, before the second dielectric layer is formed, the stop layer is formed on the upper surface of the first dielectric layer, for controlling the thickness in the manufacturing of the semiconductor structure; on the other hand, the protective layer is formed on the upper surface of the first contact structure, so that the first contact structure can be prevented from directly contacting the second dielectric layer on the protective layer, to avoid the problem of electromigration.

A specific description is provided in conjunction with an embodiment of the present disclosure:

Referring to FIG. 4 and FIG. 5 to FIG. 17, a method for manufacturing a semiconductor structure in an embodiment of the present disclosure includes the following steps.

In S101, a base 10 including a substrate 11, a first isolation layer 12, a first dielectric layer 13, and a stop layer 14 that are formed in a stack manner is provided.

In S103, a first contact hole 15 extending from the stop layer 14 into the substrate 11 is formed in the base 10, where a rim of the first contact hole 15 is flush with an upper surface of the stop layer 14.

In S105, a first insulating layer 20, a first barrier layer 30 and a first contact structure 40 filling the first contact hole 15 are sequentially formed on an inner wall of the first contact hole 15, where an upper surface of the first contact structure 40 is exposed.

In S107, a protective layer 50 covering the upper surface of the first contact structure 40 is formed.

In S109, a second dielectric layer 60 and a second isolation layer 70 are formed on the protective layer 50 in a stack manner.

In S111, a second contact hole 21 penetrating through the second dielectric layer 60, the second isolation layer 70, and the protective layer 50, stopping at the first contact structure 40, and exposing the upper surface of the first contact structure 40 is formed.

In S113, a second barrier layer 80 and a second contact structure 90 filling the second contact hole 21 are formed on an inner wall of the second contact hole 21.

In the embodiments of the present disclosure, on the one hand, during the manufacturing of the semiconductor, before the second dielectric layer 60 is formed, the stop layer 14 is formed on the upper surface of the first dielectric layer 13, for controlling the thickness of the base 10 in the manufacturing of the semiconductor structure; on the other hand, the protective layer 50 is formed on the upper surface of the first contact structure 40, so that the first contact structure 40 can be prevented from directly contacting the second dielectric layer 60 on the protective layer 50, to avoid the problem of electromigration.

In some embodiments, the operation that a first insulating layer 20, a first barrier layer 30 and a first contact structure 40 filling the first contact hole 15 are sequentially formed on an inner wall of the first contact hole 15 in S105 includes the following operations.

In S1051, the first insulating layer 20 covering the upper surface of the stop layer 14 and the inner wall of the first contact hole 15 is formed.

Figure 9:
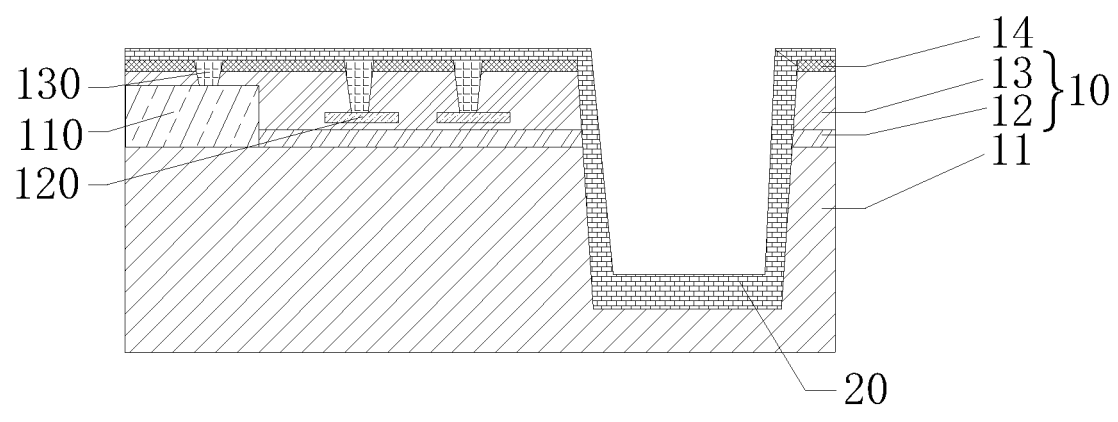
FIG. 9 is a fifth schematic structural diagram presented in steps in the flowcharts of a method for manufacturing a semiconductor structure according to an exemplary embodiment.

Referring to FIG. 9, the first insulating layer 20 is formed to cover the upper surface of the stop layer 14 and the inner wall of the first contact hole 15. It may be understood that the inner wall of the first contact hole 15 includes a bottom wall and a side wall. The material for forming the first insulating layer 20 is silicon dioxide, and the first insulating layer is used as a buffer layer during thermal expansion of the first contact structure 40.

In S1053, the first barrier layer 30 covering an upper surface of the first insulating layer 20 is formed.

Figure 10:
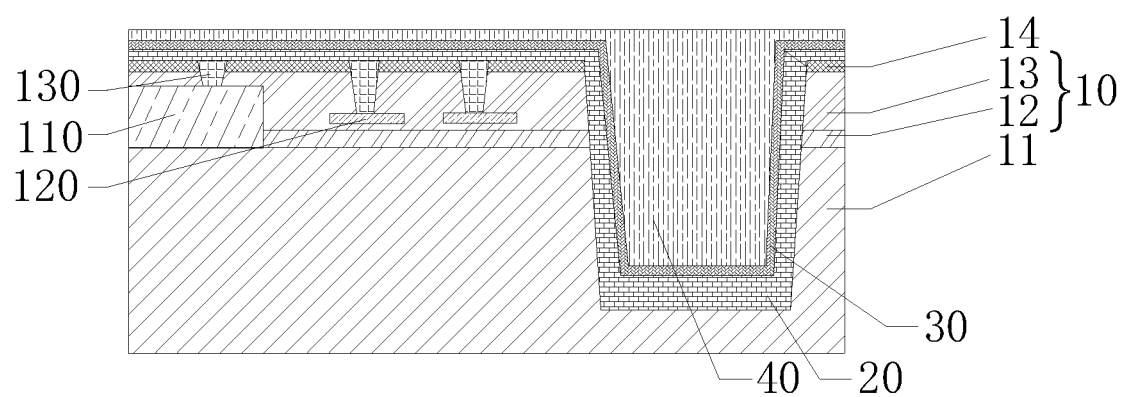
FIG. 10 is a sixth schematic structural diagram presented in steps in the flowcharts of a method for manufacturing a semiconductor structure according to an exemplary embodiment.

Referring to FIG. 10, the first barrier layer 30 covers the surface of a structural layer of the first insulating layer 20 on the stop layer 14 and the surface of a structural layer of the first insulating layer 20 in the first contact hole 15. The thickness of the first barrier layer 30 is less than the thickness of the first insulating layer 20. The material for forming the first barrier layer 30 is thallium.

In S1055, a semiconductor material is deposited on a surface of the first barrier layer 30, to form the first contact structure 40 covering the first barrier layer 30 and filling the first contact hole 15.

Continuing to refer to FIG. 10, the first contact structure 40 fills the first contact hole 15 and covers the first barrier layer 30, and the material for forming the first contact structure 40 is copper.

In S1057, the first insulating layer 20, the first barrier layer 30, and the first contact structure 40 on the upper surface of the stop layer 14 are removed, to make the upper surface of the first contact structure 40 in the first contact hole 15 flush with the upper surface of the stop layer 14.

Figure 11:
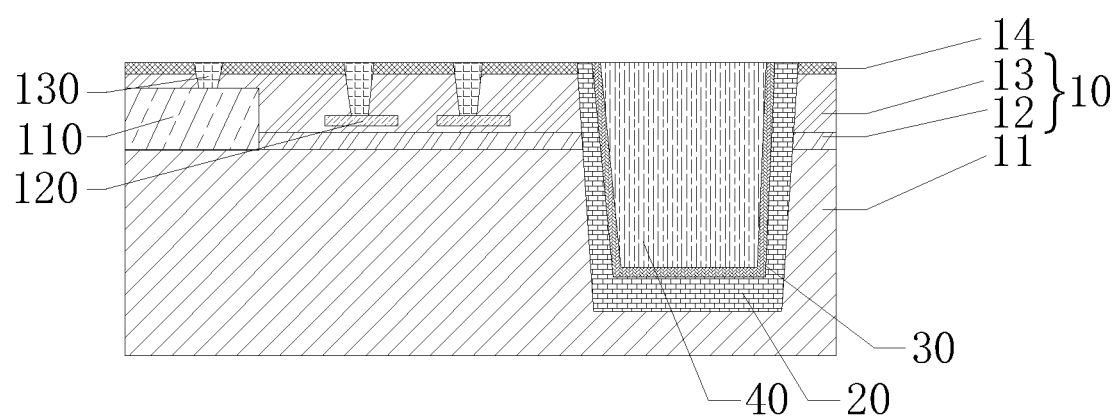
FIG. 11 is a seventh schematic structural diagram presented in steps in the flowcharts of a method for manufacturing a semiconductor structure according to an exemplary embodiment.

Referring to FIG. 11, the first insulating layer 20, the first barrier layer 30, and the first contact structure 40 on the upper surface of the stop layer 14 are removed, to expose the upper surface of the stop layer 14. After the removal, the upper surface of the first contact structure 40 in the first contact hole 15 and the exposed surfaces of the first insulating layer 20 and the first barrier layer 30 are all flush with the upper surface of the stop layer 14.

In some embodiments, the operation that the first insulating layer 20, the first barrier layer 30, and the first contact structure 40 on the upper surface of the stop layer 14 are removed, to make the upper surface of the first contact structure 40 in the first contact hole 15 flush with the upper surface of the stop layer 14 in S1057 includes the following operation.

The first insulating layer 20 and the first barrier layer 30 on the upper surface of the stop layer 14 and a partial structure of the first contact structure 40 are removed by a polishing process, to expose the upper surface of the first contact structure 40 and the surfaces of the first insulating layer 20 and the first barrier layer 30, and make them flush with the upper surface of the stop layer 14.

In the embodiments of the present disclosure, the stop layer 14 is formed on the upper surface of the first dielectric layer 13, and the stop layer 14 is used as the stop layer 14 in the polishing process, to facilitate the control of the thickness during the manufacturing of the semiconductor structure, thereby ensuring the product yield of semiconductor manufacturing.

In some embodiments, the operation that a protective layer 50 covering the upper surface of the first contact structure 40 is formed in S107 includes the following operation.

Figure 12:
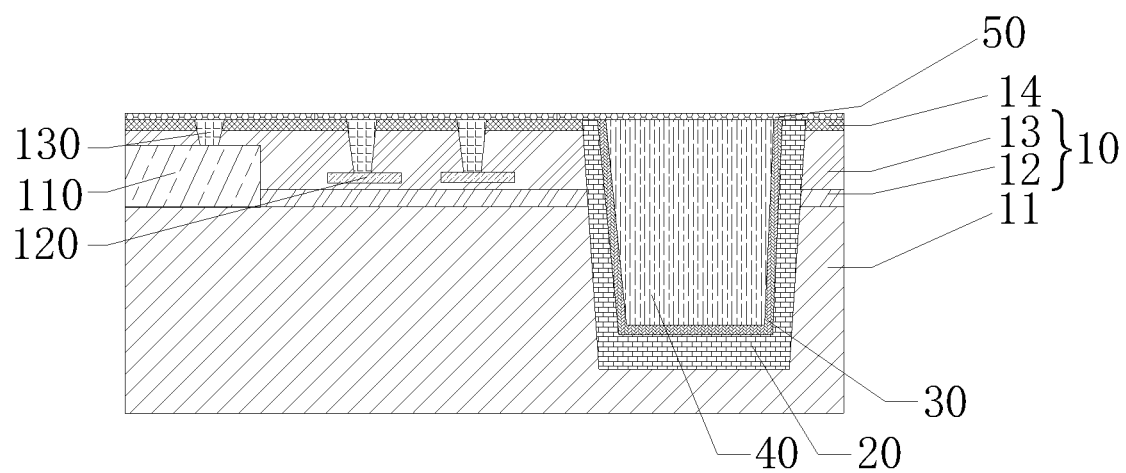
FIG. 12 is an eighth schematic structural diagram presented in steps in the flowcharts of a method for manufacturing a semiconductor structure according to an exemplary embodiment.

The protective layer 50 covering the upper surface of the first contact structure 40 is formed by a deposition process. Referring to FIG. 12, the protective layer 50 is formed to cover the exposed surface of the stop layer 14, the exposed surface of the first insulating layer 20, the exposed surface of the first barrier layer 30, and the exposed surface of the first contact structure 40. The material for forming the protective layer 50 is thallium.

Figure 13:
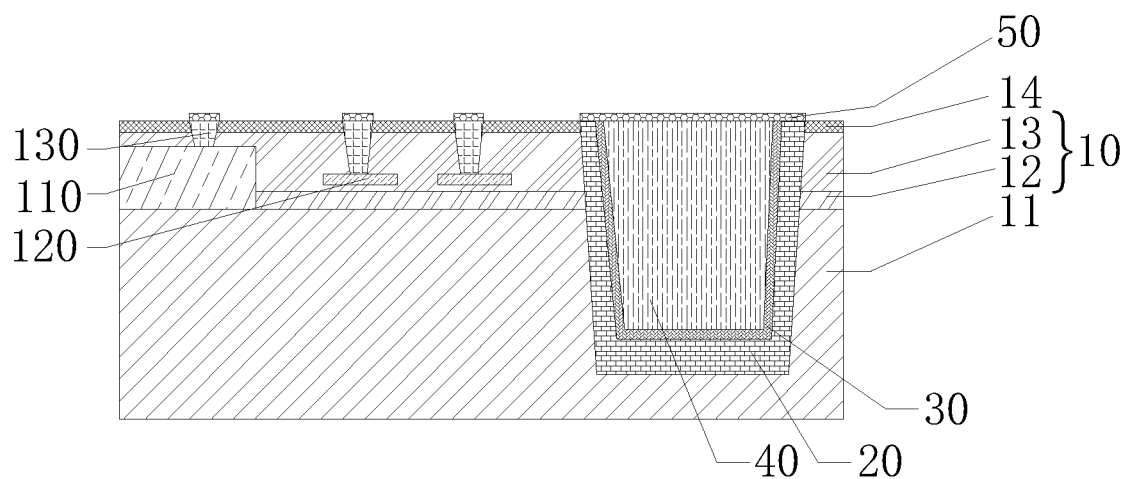
FIG. 13 is a ninth schematic structural diagram presented in steps in the flowcharts of a method for manufacturing a semiconductor structure according to an exemplary embodiment.

Referring to FIG. 13, the protective layer 50 is processed by etching, to remove the protective layer 50 on the stop layer 14. As can be seen from FIG. 13, the protective layer 50 on the first contact structure 40 covers the exposed surface of the first contact structure 40 and the exposed surfaces of the first insulating layer 20 and the first barrier layer 30, respectively.

In the embodiments of the present disclosure, the protective layer 50 is formed on the upper surface of the first contact structure 40, so that the first contact structure 40 can be prevented from directly contacting the second dielectric layer 60 on the protective layer 50, to avoid the problem of electromigration.

Figure 14:
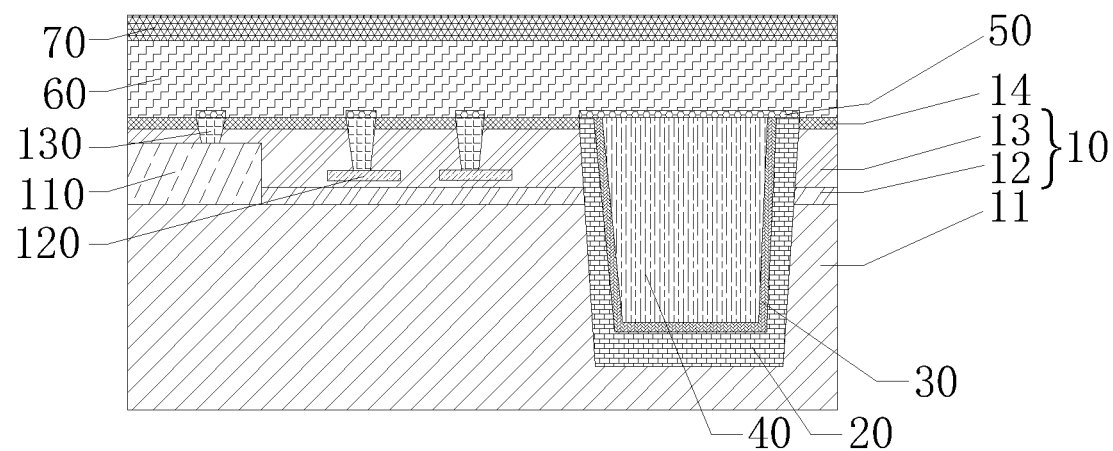
FIG. 14 is a tenth schematic structural diagram presented in steps in the flowcharts of a method for manufacturing a semiconductor structure according to an exemplary embodiment.

In some embodiments, the second dielectric layer 60 and the second isolation layer 70 are sequentially formed on the upper surface of the protective layer 50. Referring to FIG. 14, the second dielectric layer 60 is formed to cover the upper surface of the protective layer 50 and the exposed surface of the stop layer 14, and the second isolation layer 70 is formed to cover the upper surface of the second dielectric layer 60. The material for forming the second dielectric layer 60 is silicon dioxide, and the material for forming the second isolation layer 70 is silicon nitride.

In some embodiments, the operation that a second contact hole 21 penetrating through the second dielectric layer 60, the second isolation layer 70, and the protective layer 50, stopping at the first contact structure 40, and exposing the upper surface of the first contact structure 40 is formed in S111 includes the following operation.

Figure 15:
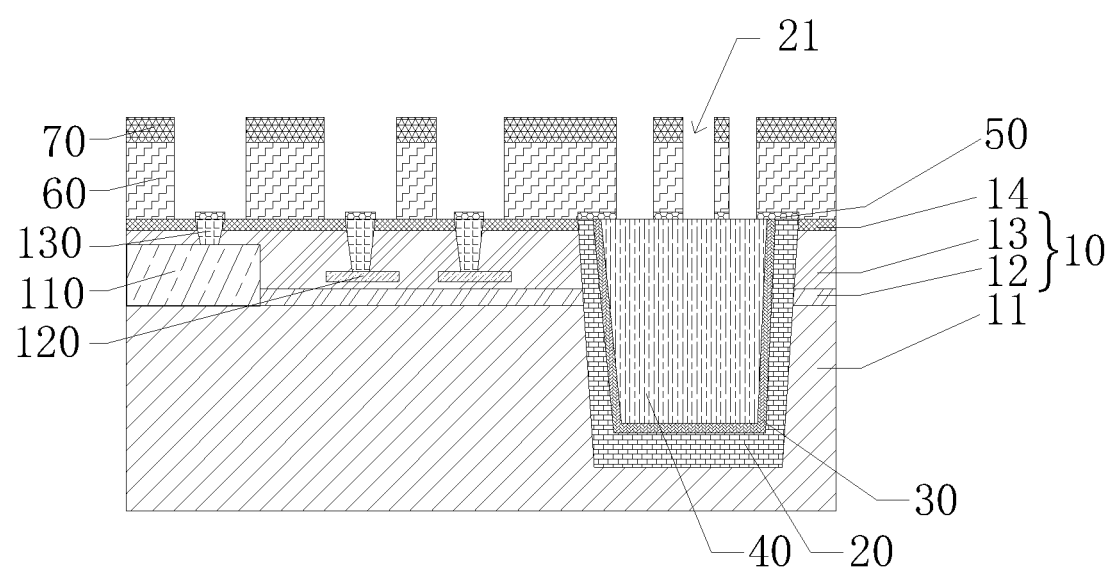
FIG. 15 is an eleventh schematic structural diagram presented in steps in the flowcharts of a method for manufacturing a semiconductor structure according to an exemplary embodiment.

Referring to FIG. 15, etching may be performed in this embodiment, and partial structures of the second isolation layer 70, the second dielectric layer 60, and the protective layer 50 are sequentially removed, to form the second contact hole 21 stopping at the first contact structure 40 and exposing the upper surface of the first contact structure 40. In this embodiment, three second contact holes 21 are formed above the first contact structure 40. The three second contact holes 21 are arranged at intervals, to separately expose the upper surface of the first contact structure 40.

In some embodiments, the operation that a second barrier layer 80 and a second contact structure 90 filling the second contact hole 21 are formed on an inner wall of the second contact hole 21 in step S113 includes the following operation.

In S1131, the second barrier layer 80 covering a surface of the second isolation layer 70 and the inner wall of the second contact hole 21 is formed.

Figure 16:
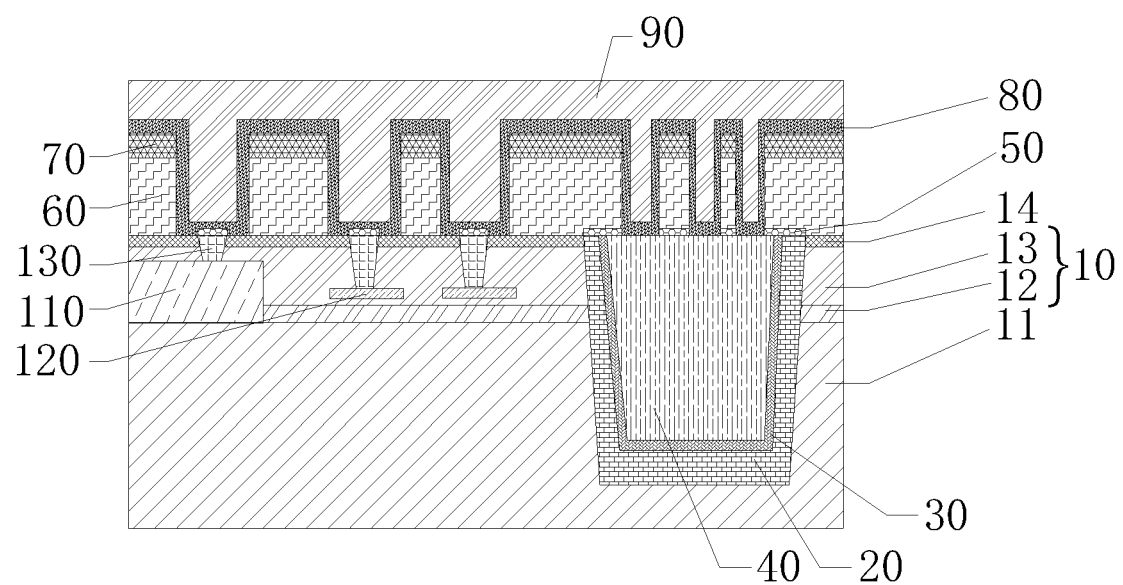
FIG. 16 is a twelfth schematic structural diagram presented in steps in the flowcharts of a method for manufacturing a semiconductor structure according to an exemplary embodiment.

Referring to FIG. 16, the second barrier layer 80 is formed by a deposition process. The second barrier layer 80 is formed to cover the upper surface of the second isolation layer 70 and the inner wall of the second contact hole 21. It may be understood that referring to FIG. 15, the inner wall of the second contact hole 21 includes a bottom wall and a side wall. The side wall of the second contact hole 21 is formed by the exposed side wall of the second isolation layer 70, the exposed side wall of the second dielectric layer 60, and the exposed side wall of the protective layer 50. The bottom wall of the second contact hole 21 is the exposed surface of the first contact structure 40. The material for forming the second barrier layer 80 is thallium.

In S1133, a semiconductor material is deposited on a surface of the second barrier layer 80, to form the second contact structure 90 covering the second barrier layer 80 and filling the second contact hole 21.

Continuing to refer to FIG. 16, the formed second contact structure 90 covers the surface of the second barrier layer 80, and the second contact structure 90 completely fills the second contact hole 21. The structural layer of the second isolation structure on the upper surface of the second isolation layer 70 has a certain thickness. The material for forming the second contact structure 90 is copper.

In S1135, the second barrier layer 80 and the second contact structure 90 on an upper surface of the second isolation layer 70 are removed, to make an upper surface of the second contact structure 90 in the second contact hole 21 flush with the upper surface of the second isolation layer 70.

In some embodiments, the operation that the second barrier layer 80 and the second contact structure 90 on an upper surface of the second isolation layer 70 are removed, to make an upper surface of the second contact structure 90 in the second contact hole 21 flush with the upper surface of the second isolation layer 70 includes the following operation.

Figure 17:
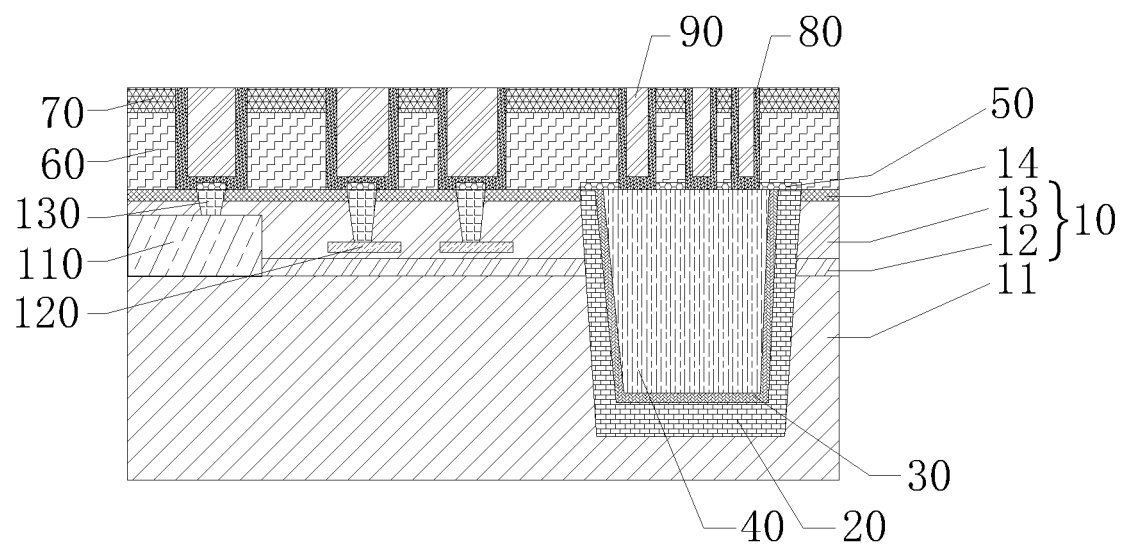
FIG. 17 is a thirteenth schematic structural diagram presented in steps in the flowcharts of a method for manufacturing a semiconductor structure according to an exemplary embodiment.

Referring to FIG. 17, the second barrier layer 80 on the upper surface of the second isolation layer 70 and a partial structure of the second contact structure 90 are removed by a polishing process. As can be seen from FIG. 17, after the polishing process, both the upper surface of the second isolation layer 70 and the upper surface of the second contact structure 90 are exposed, and the upper surface of the second contact structure 90 is flush with the upper surface of the second isolation layer 70.

In some embodiments, the stop layer 14 is formed by a deposition process, the stop layer 14 is formed to cover a surface of the first dielectric layer 13, and the material for forming the stop layer 14 includes silicon nitride.

In some embodiments, before forming the first contact hole 15, the method further includes the following operation.

A conductive via 22, stopping at a semiconductor device 110 and exposing an upper surface of the semiconductor device 110, and/or stopping at a conductive structure 120 and exposing an upper surface of the conductive structure 120 is formed in the base 10.

Referring to FIG. 7 to FIG. 17, the semiconductor device 110 and the conductive structure 120 are formed in the base 10. The semiconductor device 110 is disposed on the upper surface of the substrate 11 and is inserted in the first dielectric layer 13, and the conductive structure 120 is formed in the first dielectric layer 13. Continuing to refer to FIG. 7 to FIG. 17, a rim of the conductive via 22 is formed on the upper surface of the stop layer 14. The conductive via is formed to extend from the stop layer 14 toward the substrate 11 and stop at the upper surface of the semiconductor device 110 and/or the upper surface of the conductive structure 120.

An electrical contact structure 130 filling the conductive via 22 is formed.

Continuing to refer to FIG. 5 and FIG. 7 to FIG. 17, the electrical contact structure 130 is disposed in the conductive via 22. In this embodiment, three conductive vias 22, one semiconductor device 110, and two conductive structures 120 are specifically shown. One conductive via 22 is correspondingly formed over each of the upper surfaces of one semiconductor device 110 and two conductive structures 120, and the electrical contact structure 130 is disposed in the conductive via 22.

Figure 5:
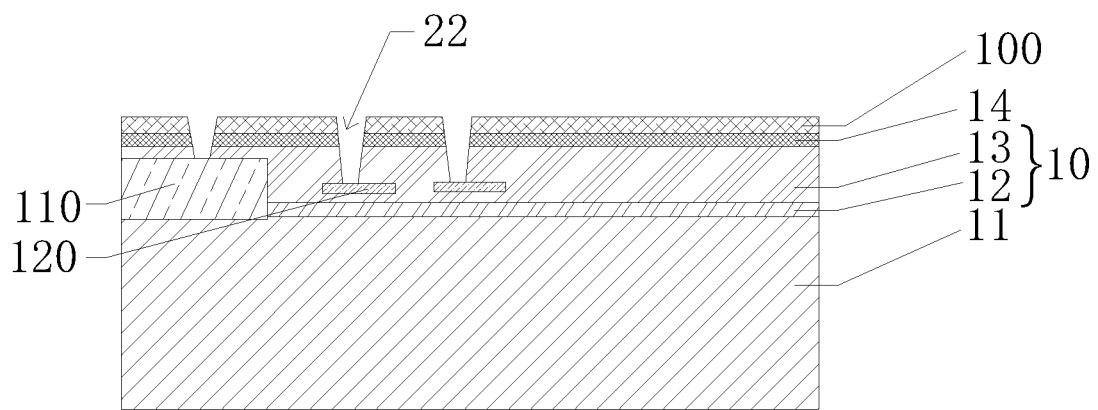
FIG. 5 is a first schematic structural diagram presented in steps in the flowcharts of a method for manufacturing a semiconductor structure according to an exemplary embodiment.

In some embodiments, referring to FIG. 5, the operation that a conductive via 22, stopping at a semiconductor device 110 and exposing an upper surface of the semiconductor device 110, and/or stopping at a conductive structure 120 and exposing an upper surface of the conductive structure 120 is formed in the base 10 includes the following operations.

A sacrifice layer 100 covering the stop layer 14 is formed.

Etching is performed to sequentially remove partial structures of the sacrifice layer 100, the stop layer 14, and the first dielectric layer 13, and form the conductive via 22 stopping at the semiconductor device 110 and/or the conductive structure 120, where a rim of the conductive via 22 is formed on an upper surface of the sacrifice layer 100.

Referring to FIG. 5, the sacrifice layer 100 is formed on the upper surface of the stop layer 14. In this embodiment, in the direction from the sacrifice layer 100 to the substrate 11, a cross-sectional size of the conductive via 22 is gradually reduced. The material for forming the sacrifice layer 100 is silicon dioxide.

In some embodiments, the operation that an electrical contact structure 130 filling the conductive via 22 is formed includes the following operation.

A semiconductor material is deposited on a surface of the sacrifice layer 100, to form the electrical contact structure 130 covering the sacrifice layer 100 and filling the conductive via 22.

Figure 6:
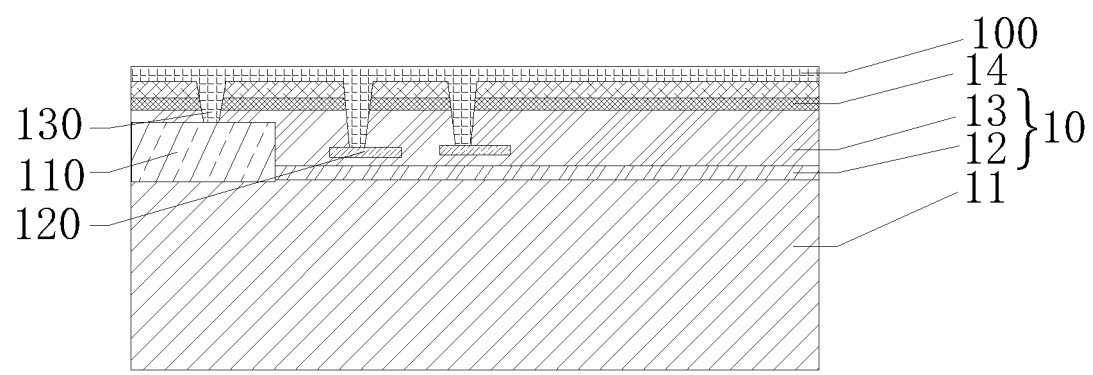
FIG. 6 is a second schematic structural diagram presented in steps in the flowcharts of a method for manufacturing a semiconductor structure according to an exemplary embodiment.

Referring to FIG. 6, the deposited semiconductor material completely fills the conductive via 22, and a structural layer with a certain thickness is formed on the upper surface of the stop layer 14. The material for forming the electrical contact structure 130 is tungsten or titanium nitride.

The electrical contact structure 130 and the sacrifice layer 100 on the upper surface of the stop layer 14 are removed, to make an upper surface of the electrical contact structure 130 in the conductive via 22 flush with the upper surface of the stop layer 14.

In some embodiments, the operation that the electrical contact structure 130 and the sacrifice layer 100 on the upper surface of the stop layer 14 are removed, to make an upper surface of the electrical contact structure 130 in the conductive via 22 flush with the upper surface of the stop layer 14 includes the following operation.

Figure 7:
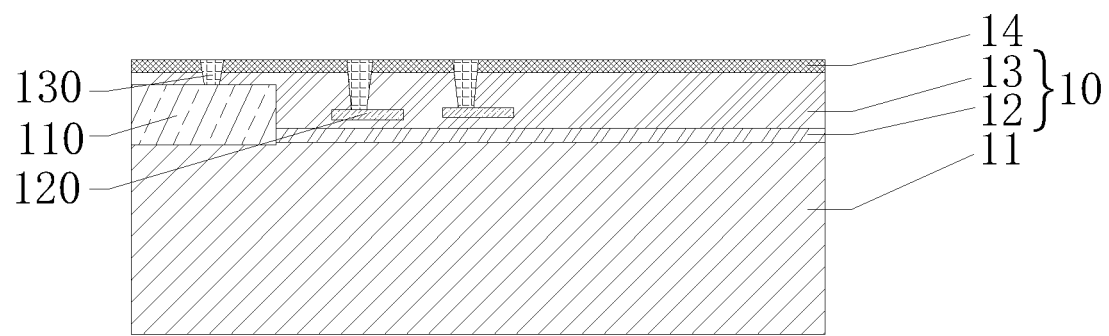
FIG. 7 is a third schematic structural diagram presented in steps in the flowcharts of a method for manufacturing a semiconductor structure according to an exemplary embodiment.
Figure 8:
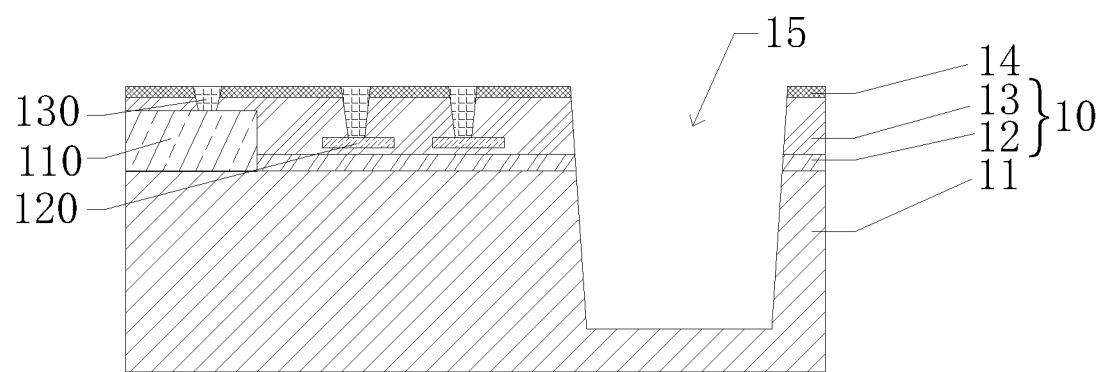
FIG. 8 is a fourth schematic structural diagram presented in steps in the flowcharts of a method for manufacturing a semiconductor structure according to an exemplary embodiment.

Referring to FIG. 7, the sacrifice layer 100 on the upper surface of the stop layer 14 and a partial structure of the electrical contact structure 130 are removed by a polishing process, to expose the upper surface of the electrical contact structure 130 and the surface of the stop layer 14 and make the upper surface of the electrical contact structure 130 flush with the upper surface of the stop layer 14.

It may be understood that in some embodiments, referring to FIG. 13 to FIG. 17, during removal of the protective layer 50, the protective layer 50 formed on the upper surface of the electrical contact structure 130 is remained, and during the manufacturing of the second contact hole 21 on the upper surface of the first contact structure 40, the second contact hole 21 is correspondingly formed above the electrical contact structure 130. In addition, the second barrier layer 80 and the second contact structure 90 are formed in the second contact hole 21 corresponding to the electrical contact structure 130 by the foregoing manufacturing steps. A specific manufacturing method has been described in the foregoing content, and therefore details are not described again.

A specific description is provided in conjunction with another embodiment of the present disclosure.

Referring to FIG. 4 and FIG. 18 to FIG. 29, a method for manufacturing a semiconductor structure in an embodiment of the present disclosure includes the following operations.

In S101, a base 10 including a substrate 11, a first isolation layer 12, a first dielectric layer 13, and a stop layer 14 that are formed in a stack manner is provided.

In S103, a first contact hole 15 extending from the stop layer 14 into the substrate 11 is formed in the base 10, where a rim of the first contact hole 15 is flush with an upper surface of the stop layer 14.

In S105, a first insulating layer 20, a first barrier layer 30 and a first contact structure 40 filling the first contact hole 15 are sequentially formed on an inner wall of the first contact hole 15, where an upper surface of the first contact structure 40 is exposed.

In S107, a protective layer 50 covering the upper surface of the first contact structure 40 is formed.

In S109, a second dielectric layer 60 and a second isolation layer 70 are formed on the protective layer 50 in a stack manner.

In S111, a second contact hole 21 penetrating through the second dielectric layer 60, the second isolation layer 70, and the protective layer 50, stopping at the first contact structure 40, and exposing the upper surface of the first contact structure 40 is formed.

In S113, a second barrier layer 80 and a second contact structure 90 filling the second contact hole 21 are formed on an inner wall of the second contact hole 21.

In the embodiments of the present disclosure, on the one hand, during the manufacturing of the semiconductor, before the second dielectric layer 60 is formed, the stop layer 14 is formed on the upper surface of the first dielectric layer 13, for controlling the thickness in the manufacturing of the semiconductor structure; on the other hand, the protective layer 50 is formed on the upper surface of the first contact structure 40, so that the first contact structure 40 can be prevented from directly contacting the second dielectric layer 60 on the protective layer 50, to avoid the problem of electromigration.

In some embodiments, the operation that a first insulating layer 20, a first barrier layer 30 and a first contact structure 40 filling the first contact hole 15 are sequentially formed on an inner wall of the first contact hole 15 in S105 includes the following operation.

In S1051, the first insulating layer 20 covering the upper surface of the stop layer 14 and the inner wall of the first contact hole 15 is formed.

Figure 22:
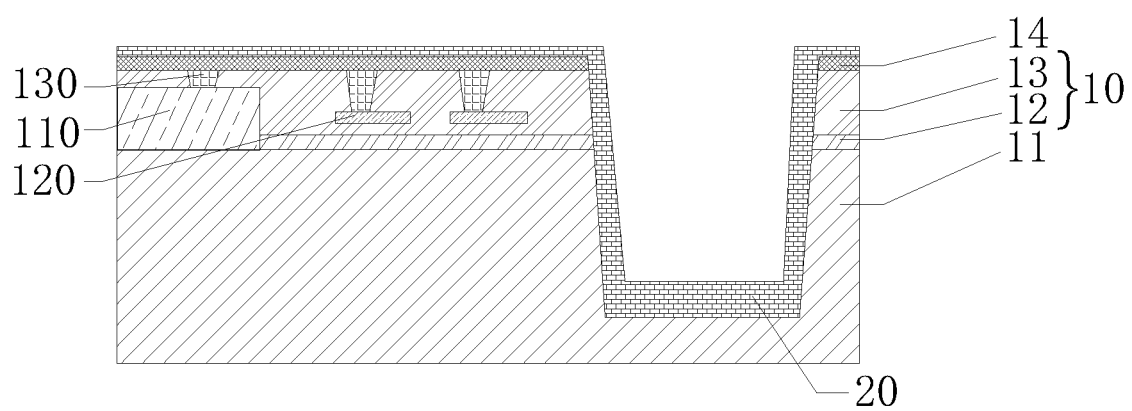
FIG. 22 is a fifth schematic structural diagram presented in steps in the flowcharts of another method for manufacturing a semiconductor structure according to an exemplary embodiment.

Referring to FIG. 22, the first insulating layer 20 is formed to cover the upper surface of the stop layer 14 and the inner wall of the first contact hole 15. It may be understood that the inner wall of the first contact hole 15 includes a bottom wall and a side wall. The material for forming the first insulating layer 20 is silicon dioxide, and the first insulating layer is used as a buffer layer during thermal expansion of the first contact structure 40.

In S1053, the first barrier layer 30 covering an upper surface of the first insulating layer 20 is formed.

Figure 23:
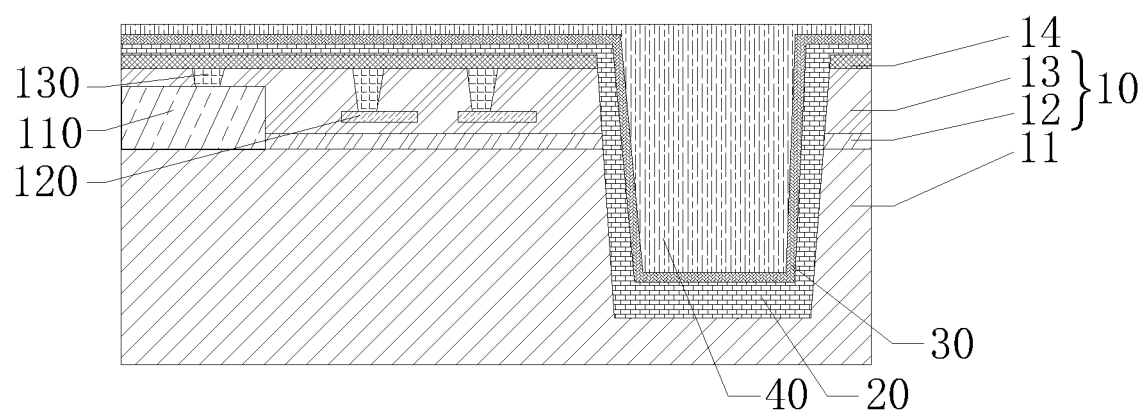
FIG. 23 is a sixth schematic structural diagram presented in steps in the flowcharts of another method for manufacturing a semiconductor structure according to an exemplary embodiment.

Referring to FIG. 23, the first barrier layer 30 covers the surface of a structural layer of the first insulating layer 20 on the stop layer 14 and the surface of a structural layer of the first insulating layer 20 in the first contact hole 15. The thickness of the first barrier layer 30 is less than the thickness of the first insulating layer 20. The material for forming the first barrier layer 30 is thallium.

In S1055, a semiconductor material is deposited on a surface of the first barrier layer 30, to form the first contact structure 40 covering the first barrier layer 30 and filling the first contact hole 15.

Continuing to refer to FIG. 23, the first contact structure 40 fills the first contact hole 15 and covers the first barrier layer 30, and the material for forming the first contact structure 40 is copper.

In S1057, the first insulating layer 20, the first barrier layer 30, and the first contact structure 40 on the upper surface of the stop layer 14 are removed, to make the upper surface of the first contact structure 40 in the first contact hole 15 flush with the upper surface of the stop layer 14.

Figure 24:
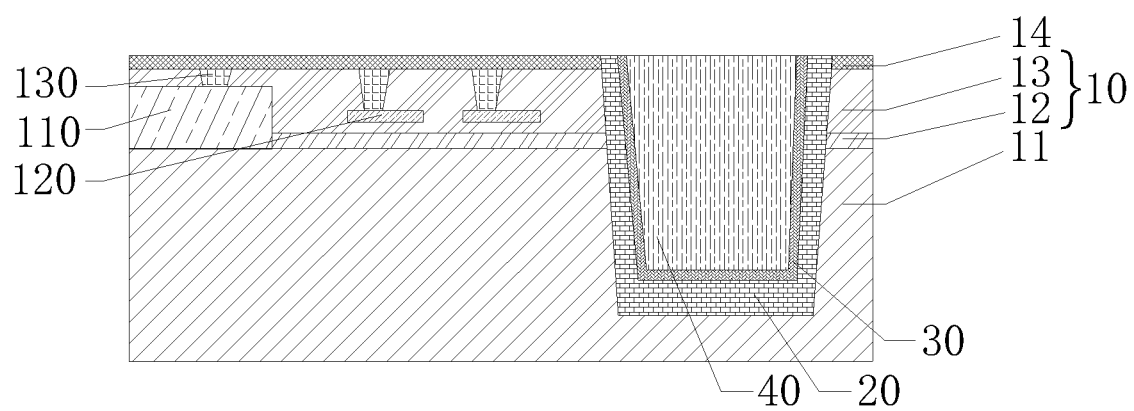
FIG. 24 is a seventh schematic structural diagram presented in steps in the flowcharts of another method for manufacturing a semiconductor structure according to an exemplary embodiment.

Referring to FIG. 24, the first insulating layer 20, the first barrier layer 30, and the first contact structure 40 on the upper surface of the stop layer 14 are removed, to expose the upper surface of the stop layer 14. After the removal, the upper surface of the first contact structure 40 in the first contact hole 15 and the exposed surfaces of the first insulating layer 20 and the first barrier layer 30 are all flush with the upper surface of the stop layer 14.

In some embodiments, the operation that the first insulating layer 20, the first barrier layer 30, and the first contact structure 40 on the upper surface of the stop layer 14 are removed, to make the upper surface of the first contact structure 40 in the first contact hole 15 flush with the upper surface of the stop layer 14 in S1057 includes the following operation.

The first insulating layer 20 and the first barrier layer 30 on the upper surface of the stop layer 14 and a partial structure of the first contact structure 40 are removed by a polishing process, so that the upper surface of the first contact structure 40 and the surfaces of the first insulating layer 20 and the first barrier layer 30 are exposed, and are flush with the upper surface of the stop layer 14.

In the embodiments of the present disclosure, the stop layer 14 is formed on the upper surface of the first dielectric layer 13, and the stop layer 14 is used as the stop layer 14 in the polishing process, to facilitate the control of the thickness during the manufacturing of the semiconductor structure, thereby ensuring the product yield of semiconductor manufacturing.

In some embodiments, the operation that a protective layer 50 covering the upper surface of the first contact structure 40 is formed in step S107 includes the following operation.

Figure 25:
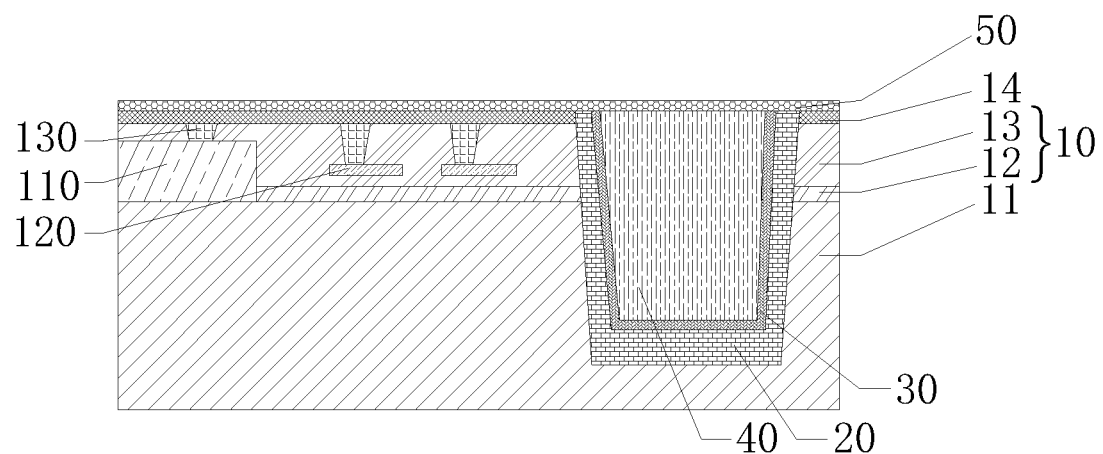
FIG. 25 is an eighth schematic structural diagram presented in steps in the flowcharts of another method for manufacturing a semiconductor structure according to an exemplary embodiment.

The protective layer 50 covering the upper surface of the first contact structure 40 is formed by a deposition process. Referring to FIG. 25, the protective layer 50 is formed to cover the exposed surface of the stop layer 14, the exposed surface of the first insulating layer 20, the exposed surface of the first barrier layer 30, and the exposed surface of the first contact structure 40. The material for forming the protective layer 50 is silicon nitride.

In the embodiments of the present disclosure, the protective layer 50 is formed on the upper surface of the first contact structure 40, so that the first contact structure 40 can be prevented from directly contacting the second dielectric layer 60 on the protective layer 50, to avoid the problem of electromigration.

Figure 26:
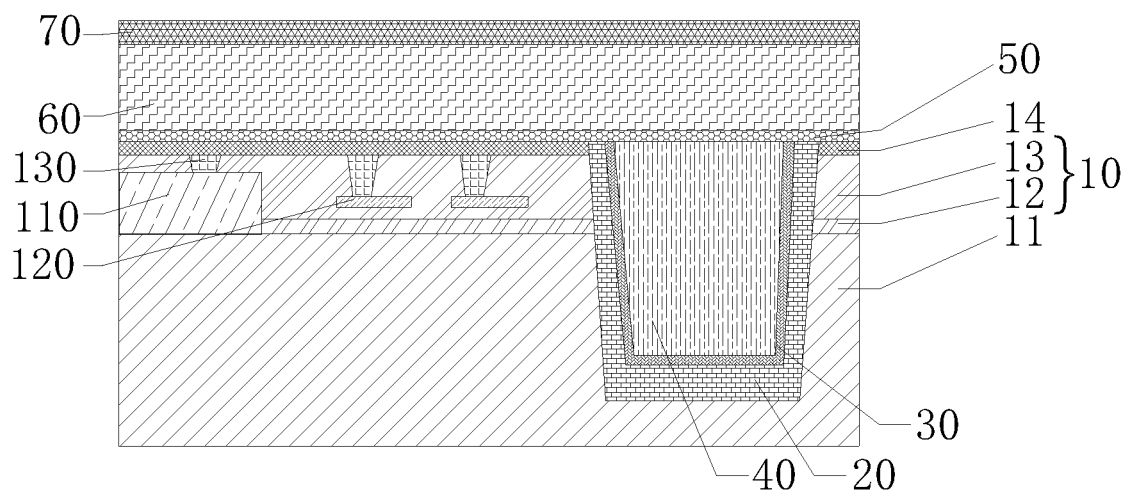
FIG. 26 is a ninth schematic structural diagram presented in steps in the flowcharts of another method for manufacturing a semiconductor structure according to an exemplary embodiment.

In some embodiments, the second dielectric layer 60 and the second isolation layer 70 are sequentially formed on the upper surface of the protective layer 50 by deposition process. Referring to FIG. 26, the second dielectric layer 60 is formed to cover the upper surface of the protective layer 50, and the second isolation layer 70 is formed to cover the upper surface of the second dielectric layer 60. The material for forming the second dielectric layer 60 is silicon dioxide, and the material for forming the second isolation layer 70 is silicon nitride.

In some embodiments, the operation that a second contact hole 21 penetrating through the second dielectric layer 60, the second isolation layer 70, and the protective layer 50, stopping at the first contact structure 40, and exposing the upper surface of the first contact structure 40 is formed in S111 includes the following operation.

Figure 27:
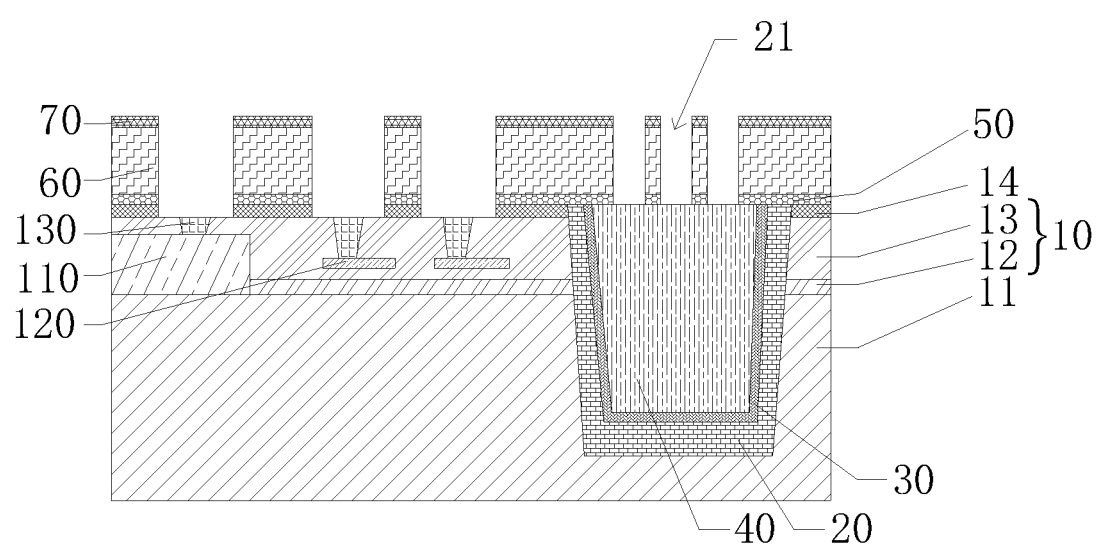
FIG. 27 is a tenth schematic structural diagram presented in steps in the flowcharts of another method for manufacturing a semiconductor structure according to an exemplary embodiment.

Referring to FIG. 27, etching may be performed in this embodiment, to sequentially remove partial structures of the second dielectric layer 60, the second isolation layer 70, and the protective layer 50, to form the second contact hole 21 stopping at the first contact structure 40 and exposing the upper surface of the first contact structure 40. In this embodiment, three second contact holes 21 are formed on the top of the first contact structure 40. The three second contact holes 21 are arranged at intervals, and separately expose the upper surface of the first contact structure 40.

In some embodiments, the operation that a second barrier layer 80 and a second contact structure 90 filling the second contact hole 21 are formed on an inner wall of the second contact hole 21 in S113 includes the following operation.

In S1131, the second barrier layer 80 covering a surface of the second isolation layer 70 and the inner wall of the second contact hole 21 is formed.

Figure 28:
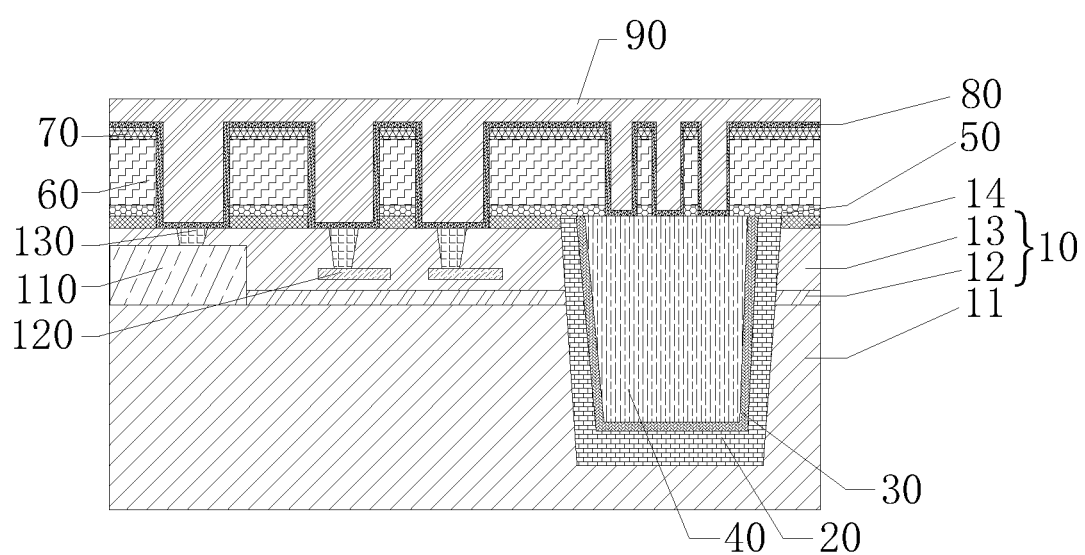
FIG. 28 is an eleventh schematic structural diagram presented in steps in the flowcharts of another method for manufacturing a semiconductor structure according to an exemplary embodiment.

Referring to FIG. 28, the second barrier layer 80 is formed by a deposition process. The second barrier layer 80 is formed to cover the upper surface of the second isolation layer 70 and the inner wall of the second contact hole 21. It may be understood that referring to FIG. 28, the inner wall of the second contact hole 21 includes a bottom wall and a side wall. The side wall of the second contact hole 21 is formed by the exposed side wall of the second isolation layer 70, the exposed side wall of the second dielectric layer 60, and the exposed side wall of the protective layer 50. The bottom wall of the second contact hole 21 is the exposed surface of the first contact structure 40. The material for forming the second barrier layer 80 is thallium.

In S1133, a semiconductor material is deposited on a surface of the second barrier layer 80, and the second contact structure 90 covering the second barrier layer 80 and filling the second contact hole 21 is formed.

Continuing to refer to FIG. 28, the formed second contact structure 90 covers the surface of the second barrier layer 80, and the second contact structure 90 completely fills the second contact hole 21. The structural layer of the second isolation structure on the upper surface of the second isolation layer 70 has a certain thickness. The material for forming the second contact structure 90 is copper.

In S1135, the second barrier layer 80 and the second contact structure 90 on an upper surface of the second isolation layer 70 are removed, to make an upper surface of the second contact structure 90 in the second contact hole 21 flush with the upper surface of the second isolation layer 70.

In some embodiments, the operation that the second barrier layer 80 and the second contact structure 90 on an upper surface of the second isolation layer 70 are removed, to make an upper surface of the second contact structure 90 in the second contact hole 21 flush with the upper surface of the second isolation layer 70 includes the following operation.

Figure 29:
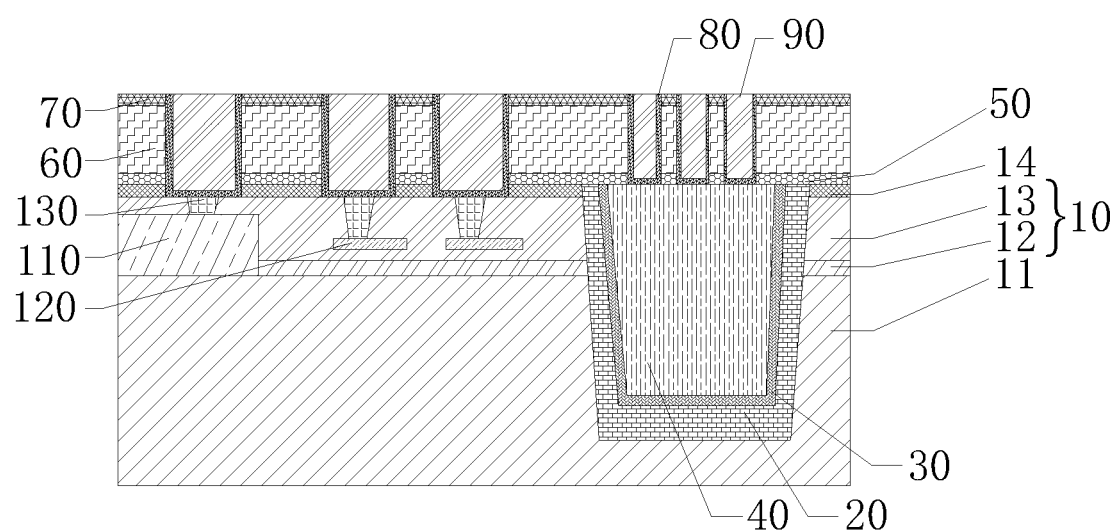
FIG. 29 is a twelfth schematic structural diagram presented in steps in the flowcharts of another method for manufacturing a semiconductor structure according to an exemplary embodiment.

Referring to FIG. 29, the second barrier layer 80 on the upper surface of the second isolation layer 70 and a partial structure of the second contact structure 90 are removed by a polishing process, to make the upper surface of the second contact structure 90 flush with the upper surface of the second isolation layer 70. As can be seen from FIG. 29, after the polishing process, both the upper surface of the second isolation layer 70 and the upper surface of the second contact structure 90 are exposed, and the upper surface of the second contact structure 90 is flush with the upper surface of the second isolation layer 70.

In some embodiments, before forming the first contact hole 15, the method further includes the following operation.

A conductive via 22 stopping at a semiconductor device 110 and exposing an upper surface of the semiconductor device 110, and/or stopping at a conductive structure 120 and exposing an upper surface of the conductive structure 120 is formed in the base 10.

Referring to FIG. 21 to FIG. 29, the semiconductor device 110 and the conductive structure 120 are formed in the base 10. The semiconductor device 110 is disposed on the upper surface of the substrate 11 and is inserted in the first dielectric layer 13, and the conductive structure 120 is formed in the first dielectric layer 13. Continuing to refer to FIG. 21 to FIG. 29, a rim of the conductive via 22 is formed on the upper surface of the first dielectric layer 13. The conductive via is formed to extend from the first dielectric layer 13 toward the substrate 11 and stop at the upper surface of the semiconductor device 110 and/or the upper surface of the conductive structure 120.

An electrical contact structure 130 filling the conductive via 22 is formed.

Continuing to refer to FIG. 21 to FIG. 29, the electrical contact structure 130 is disposed in the conductive via 22. In this embodiment, three conductive vias 22, one semiconductor device 110, and two conductive structures 120 are specifically shown. One conductive via 22 is correspondingly formed over each of the upper surfaces of one semiconductor device 110 and two conductive structures 120, and the electrical contact structure 130 is disposed in the conductive via 22.

In some embodiments, the operation that a conductive via 22 stopping at a semiconductor device 110 and exposing an upper surface of the semiconductor device 110, and/or stopping at a conductive structure 120 and exposing an upper surface of the conductive structure 120 is formed in the base 10 includes the following operation.

Etching is performed, to remove a partial structure of the first dielectric layer 13, thereby forming the conductive via 22 stopping at the semiconductor device 110 and/or the conductive structure 120, where a rim of the conductive via 22 is formed on an upper surface of the first dielectric layer 13.

Figure 18:
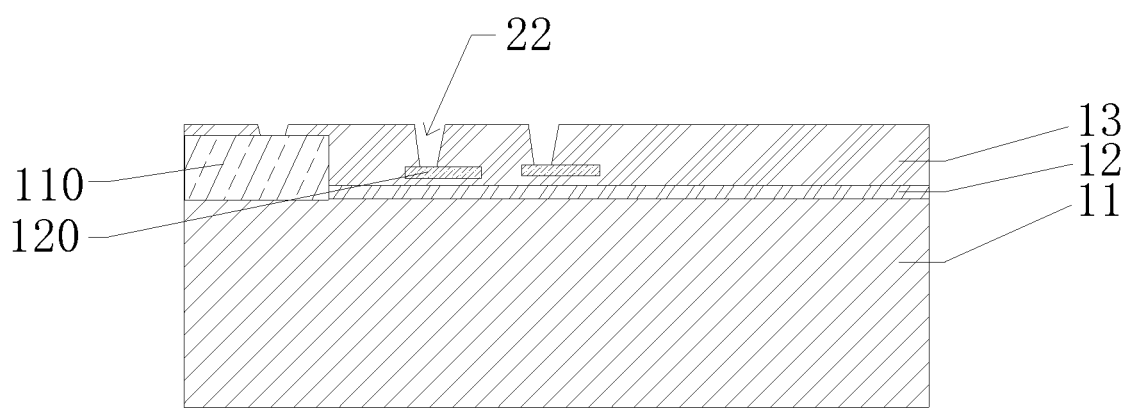
FIG. 18 is a first schematic structural diagram presented in steps in the flowcharts of another method for manufacturing a semiconductor structure according to an exemplary embodiment.

Referring to FIG. 18, in this embodiment, the first dielectric layer 13 is etched by an etching process, to form the conductive via 22 with a cross-sectional size gradually decreased in the direction from the first dielectric layer 13 toward the substrate 11.

In some embodiments, the operation that an electrical contact structure 130 filling the conductive via 22 is formed includes the following operation.

A semiconductor material is deposited on a surface of the first dielectric layer 13, to form an electrical contact structure 130 covering the first dielectric layer 13 and filling the conductive via 22.

Figure 19:
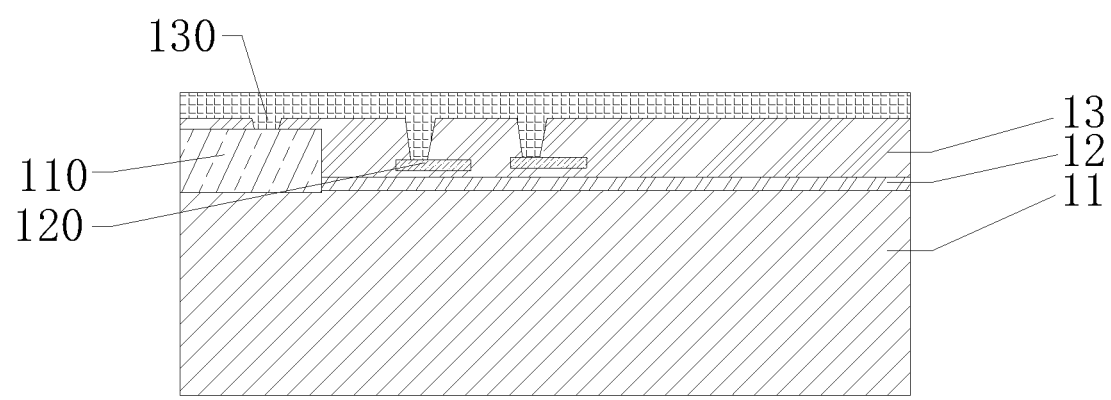
FIG. 19 is a second schematic structural diagram presented in steps in the flowcharts of another method for manufacturing a semiconductor structure according to an exemplary embodiment.

Referring to FIG. 19, the deposited semiconductor material completely fills the conductive via 22, and a structural layer with a certain thickness is formed on the upper surface of the first dielectric layer 13. The material for forming the electrical contact structure 130 is tungsten.

The electrical contact structure 130 on the upper surface of the first dielectric layer 13 is removed, to make an upper surface of the electrical contact structure 130 in the conductive via 22 flush with the upper surface of the first dielectric layer 13.

In some embodiments, the operation that the electrical contact structure 130 on the upper surface of the first dielectric layer 13 is removed, to make an upper surface of the electrical contact structure 130 in the conductive via 22 flush with the upper surface of the first dielectric layer 13 includes the following operation.

Figure 20:
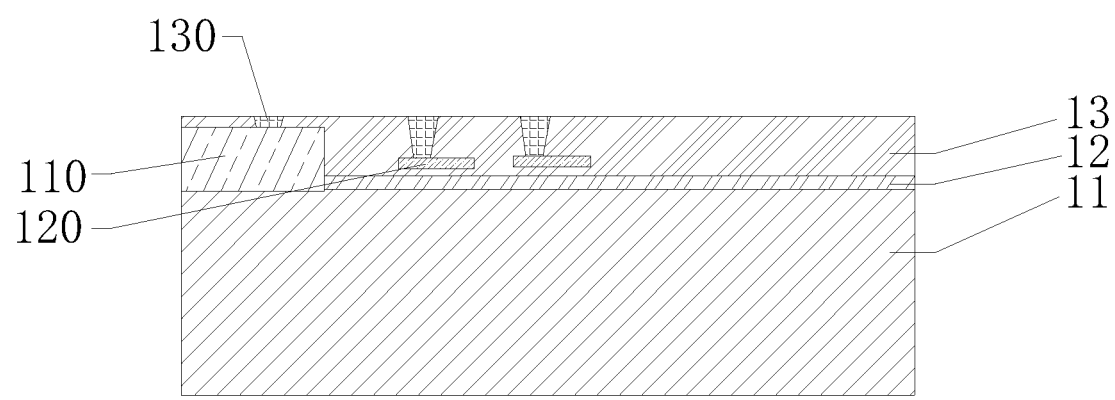
FIG. 20 is a third schematic structural diagram presented in steps in the flowcharts of another method for manufacturing a semiconductor structure according to an exemplary embodiment.
Figure 21:
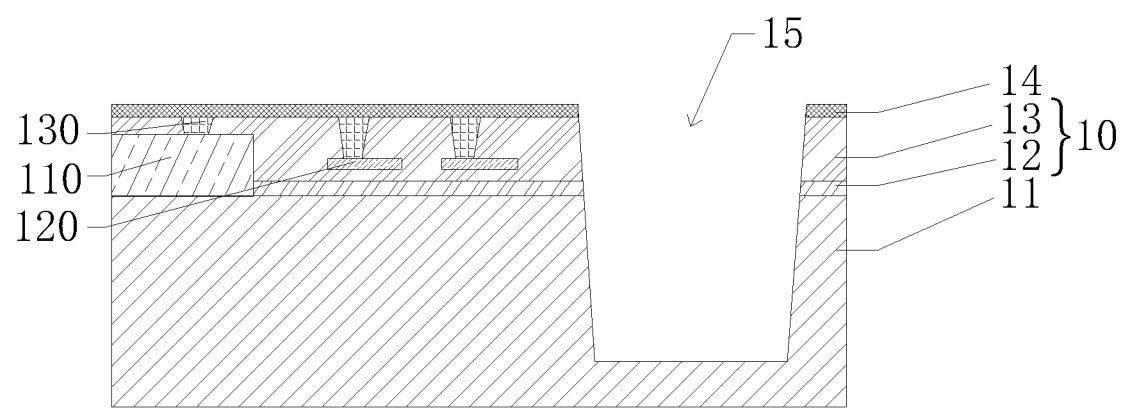
FIG. 21 is a fourth schematic structural diagram presented in steps in the flowcharts of another method for manufacturing a semiconductor structure according to an exemplary embodiment.

Referring to FIG. 20, the electrical contact structure 130 on the upper surface of the first dielectric layer 13 is removed by a polishing process, to make an upper surface of the electrical contact structure 130 flush with the upper surface of the first dielectric layer 13.

It may be understood that in some embodiments, referring to FIG. 21 to FIG. 29, a difference lies in that during removal of the protective layer 50 in this embodiment, the protective layer 50 and the stop layer 14 formed on the upper surface of the electrical contact structure 130 are removed, and during the manufacturing of the second contact hole 21 above the upper surface of the first contact structure 40, the second contact hole 21 is correspondingly formed above the electrical contact structure 130. In addition, the second barrier layer 80 and the second contact structure 90 are formed in the second contact hole 21 corresponding to the electrical contact structure 130 by the foregoing manufacturing steps. A specific manufacturing method has been described in the foregoing content, and therefore details are not described again.

A third aspect of the embodiments of the present application provides a memory, including the foregoing semiconductor structure.

It should be understood that the above specific embodiments of the present application are used only for exemplary description or explanation of the principles of present disclosure, and do not constitute a limitation on the present disclosure. Accordingly, any modification, equivalent replacement, improvement, or the like made without departing from the spirit and scope of the present disclosure shall be included in the scope of protection of the present disclosure. In addition, the claims appended to the present disclosure are intended to cover all variations and modifications of examples that fall within the scope and boundaries of the appended claims, or the equivalent form of such scope and boundaries.

What is claimed is:

1. A method for manufacturing a semiconductor structure, comprising:
   providing a base comprising a substrate, a first isolation layer, a first dielectric layer, and a stop layer that are formed in a stack manner;
   forming in the base a first contact hole extending from the stop layer into the substrate, wherein a rim of the first contact hole is flush with an upper surface of the stop layer;
   forming sequentially on an inner wall of the first contact hole a first insulating layer, a first barrier layer and a first contact structure filling the first contact hole, wherein an upper surface of the first contact structure is exposed;
   forming a protective layer covering the upper surface of the first contact structure;
   forming a second dielectric layer and a second isolation layer on the protective layer in a stack manner;
   forming a second contact hole penetrating through the second dielectric layer, the second isolation layer, and the protective layer, stopping at the first contact structure, and exposing the upper surface of the first contact structure; and
   forming on an inner wall of the second contact hole a second barrier layer and a second contact structure filing the second contact hole;
   wherein the forming sequentially on an inner wall of the first contact hole a first insulating layer, a first barrier layer and a first contact structure filling the first contact hole comprises:
   forming the first insulating layer covering the upper surface of the stop layer and the inner wall of the first contact hole;
   forming the first barrier layer covering an upper surface of the first insulating layer;
   depositing a semiconductor material on a surface of the first barrier layer, to form the first contact structure covering the first barrier layer and filling the first contact hole; and
   removing the first insulating layer, the first barrier layer, and the first contact structure on the upper surface of the stop layer, to make the upper surface of the first contact structure in the first contact hole flush with the upper surface of the stop layer;
wherein the forming a protective layer covering the upper surface of the first contact structure comprises:
forming the protective layer covering the upper surface of the first contact structure and a surface of the stop layer by a deposition process.

2. The method for manufacturing a semiconductor structure according to claim 1, wherein the removing the first insulating layer, the first barrier layer, and the first contact structure on the upper surface of the stop layer, to make the upper surface of the first contact structure in the first contact hole flush with the upper surface of the stop layer comprises:
removing the first insulating layer and the first barrier layer on the upper surface of the stop layer and a partial structure of the first contact structure by a polishing process, to make the upper surface of the first contact structure flush with the upper surface of the stop layer.

3. The method for manufacturing a semiconductor structure according to claim 1, wherein the forming a protective layer covering the upper surface of the first contact structure comprises:
forming the protective layer covering the upper surface of the first contact structure by a deposition process, wherein a material for forming the protective layer comprises tantalum or silicon nitride.

4. The method for manufacturing a semiconductor structure according to claim 1, wherein the forming a second contact hole penetrating through the second dielectric layer, the second isolation layer, and the protective layer, stopping at the first contact structure, and exposing the upper surface of the first contact structure comprises:
performing etching, to sequentially remove partial structures of the second dielectric layer, the second isolation layer, and the protective layer, thereby forming the second contact hole stopping at the first contact structure and exposing the upper surface of the first contact structure.

5. The method for manufacturing a semiconductor structure according to claim 1, wherein the forming on an inner wall of the second contact hole a second barrier layer and a second contact structure filing the second contact hole comprises:
forming the second barrier layer covering a surface of the second isolation layer and the inner wall of the second contact hole;
depositing a semiconductor material on a surface of the second barrier layer, to form the second contact structure covering the second barrier layer and filling the second contact hole; and
removing the second barrier layer and the second contact structure on an upper surface of the second isolation layer, to make an upper surface of the second contact structure in the second contact hole flush with the upper surface of the second isolation layer.

6. The method for manufacturing a semiconductor structure according to claim 5, wherein the removing the second barrier layer and the second contact structure on an upper surface of the second isolation layer, to make an upper surface of the second contact structure in the second contact hole flush with the upper surface of the second isolation layer comprises:
removing the second barrier layer on the upper surface of the second isolation layer and a partial structure of the second contact structure by a polishing process, to make the upper surface of the second contact structure flush with the upper surface of the second isolation layer.

7. The method for manufacturing a semiconductor structure according to claim 1, wherein
the stop layer is formed by a deposition process and covers a surface of the first dielectric layer, and wherein a material forming the stop layer comprises silicon nitride.

8. The method for manufacturing a semiconductor structure according to claim 1, further comprising:
forming in the base a conductive via stopping at at least one of a semiconductor device or a conductive structure, and correspondingly exposing at least one of an upper surface of the semiconductor device or an upper surface of the conductive structure; and
forming an electrical contact structure filling the conductive via.

9. The method for manufacturing a semiconductor structure according to claim 8, wherein the forming in the base a conductive via stopping at at least one of a semiconductor device or a conductive structure, and correspondingly exposing at least one of an upper surface of the semiconductor device or an upper surface of the conductive structure comprises:
forming a sacrifice layer covering the stop layer; and
performing etching to sequentially remove partial structures of the sacrifice layer, the stop layer, and the first dielectric layer, thereby forming the conductive via stopping at at least one of the semiconductor device or the conductive structure, wherein a rim of the conductive via is formed on an upper surface of the sacrifice layer.

10. The method for manufacturing a semiconductor structure according to claim 9, wherein the forming an electrical contact structure filling the conductive via comprises:
depositing a semiconductor material on a surface of the sacrifice layer, to form the electrical contact structure covering the sacrifice layer and filling the conductive via; and
removing the electrical contact structure and the sacrifice layer on the upper surface of the stop layer, to make an upper surface of the electrical contact structure in the conductive via flush with the upper surface of the stop layer.

11. The method for manufacturing a semiconductor structure according to claim 10, wherein the removing the electrical contact structure and the sacrifice layer on the upper surface of the stop layer, to make an upper surface of the electrical contact structure in the conductive via flush with the upper surface of the stop layer comprises:
removing the sacrifice layer on the upper surface of the stop layer and a partial structure of the electrical contact structure by a polishing process, to make the upper surface of the electrical contact structure flush with the upper surface of the stop layer.

12. The method for manufacturing a semiconductor structure according to claim 8, wherein the forming in the base a conductive via stopping at at least one of a semiconductor device or a conductive structure, and correspondingly exposing at least one of an upper surface of the semiconductor device or an upper surface of the conductive structure comprises:
performing etching, to remove a partial structure of the first dielectric layer, thereby forming the conductive via stopping at at least one of the semiconductor device or the conductive structure, wherein a rim of the conductive via is formed on an upper surface of the first dielectric layer.

13. The method for manufacturing a semiconductor structure according to claim 12, wherein the forming an electrical contact structure filling the conductive via comprises:
depositing a semiconductor material on a surface of the first dielectric layer, to form the electrical contact structure covering the first dielectric layer and filling the conductive via; and
removing the electrical contact structure on the upper surface of the first dielectric layer, to make the upper surface of the electrical contact structure in the conductive via flush with the upper surface of the first dielectric layer.

14. The method for manufacturing a semiconductor structure according to claim 13, wherein the removing the electrical contact structure on the upper surface of the first dielectric layer, to make the upper surface of the electrical contact structure in the conductive via flush with the upper surface of the first dielectric layer comprises:
removing the electrical contact structure on the upper surface of the first dielectric layer by a polishing process, to make the upper surface of the electrical contact structure flush with the upper surface of the first dielectric layer.

* * * * *